US012615978B2

(12) United States Patent
     Kou et al.

(10) Patent No.: US 12,615,978 B2
(45) Date of Patent: Apr. 28, 2026

(54) NON-CONTACT PROCESSING DEVICE AND PROCESSING METHOD INCLUDING MODIFICATION ENERGY AND SEPARATION ENERGY

(71) Applicant: HIGHLIGHT TECH CORP., Tainan City (TW)

(72) Inventors: Chwung-Shan Kou, Tainan City (TW); Wen-Yung Yeh, Tainan City (TW)

(73) Assignee: HIGHLIGHT TECH CORP., Tainan City (TW)

( * ) Notice: Subject to any disclaimer, the term of this patent is extended or adjusted under 35 U.S.C. 154(b) by 983 days.

(21) Appl. No.: 17/742,447

(22) Filed: May 12, 2022

(65) Prior Publication Data

US 2022/0367190 A1    Nov. 17, 2022

Related U.S. Application Data

(60) Provisional application No. 63/302,974, filed on Jan. 25, 2022, provisional application No. 63/188,478, filed on May 14, 2021.

(30) Foreign Application Priority Data

May 5, 2022    (TW) .................................. 111117036

(51) Int. Cl.
     *H10P 34/42*          (2026.01)
     *B23K 26/53*          (2014.01)
     (Continued)

(52) U.S. Cl.
     CPC .............. *H10P 34/42* (2026.01); *B23K 26/53* (2015.10); *H10P 72/0436* (2026.01); *H10P 74/23* (2026.01)

(58) Field of Classification Search
     CPC . H01L 21/268; H01L 21/67115; H01L 22/20; H01L 21/78; H01L 21/67092;
     (Continued)

(56) References Cited

U.S. PATENT DOCUMENTS 5,406,214 A          4/1995  Boda et al.
2011/0294403 A1*    12/2011  Koutake .............. B28D 5/0082
                                                            451/53
(Continued)

FOREIGN PATENT DOCUMENTS

CN          103700577 A      4/2014
CN          105405806 A      3/2016
            (Continued)

*Primary Examiner* — John P. Dulka

(57) ABSTRACT

A non-contact processing device and a non-contact processing method are used to perform a processing procedure on a solid structure. The non-contact processing device of the invention uses an electromagnetic radiation source to provide energy to the solid structure to cause qualitative changes or defects in the solid structure, that is, to form a modified layer. A separation energy source is used to apply a separation energy on the solid structure with the modified layer in a non-contact manner. With stress, structural strength, lattice pattern or hardness of the modified layer being different from that of other non-processing areas, the solid structure can be rapidly separated or thinned at the modified layer.

29 Claims, 23 Drawing Sheets

(51) Int. Cl.
    *H10P 72/00*       (2026.01)
    *H10P 74/00*       (2026.01)

(58) Field of Classification Search
    CPC .. B23K 26/0626; B23K 26/702; B23K 26/53;
             H10P 34/42; H10P 72/0436; H10P 74/23
    See application file for complete search history.

(56)             References Cited

U.S. PATENT DOCUMENTS

| | | |
|---|---|---|
| 2016/0071770 A1 | 3/2016 | Albermann et al. |
| 2017/0136572 A1 | 5/2017 | Hirata |
| 2018/0229331 A1* | 8/2018 | Hirata .................... B23K 26/53 |
| 2019/0296125 A1 | 9/2019 | Schulze et al. |
| 2019/0337069 A1* | 11/2019 | Ojha ........................ B23H 7/06 |

FOREIGN PATENT DOCUMENTS

| | | | |
|---|---|---|---|
| CN | 106661758 | A | 5/2017 |
| CN | 110299323 | A | 10/2019 |
| JP | 2004186589 | A | 7/2004 |
| JP | 2008004648 | A | 1/2008 |
| JP | 2011249449 | A | 12/2011 |
| JP | 2012109341 | | 6/2012 |
| JP | 2013049161 | | 3/2013 |
| JP | 2013124206 | | 6/2013 |
| JP | 2014033164 | A | 2/2014 |
| JP | 2015046480 | | 3/2015 |
| JP | 2019208018 | | 12/2019 |
| JP | 2020191335 | | 11/2020 |
| TW | 201921554 | | 6/2019 |
| TW | 202039129 | A | 11/2020 |
| WO | WO-2014203240 | A1 * | 12/2014 ............. B23K 26/53 |

* cited by examiner

110

100

NON-CONTACT PROCESSING DEVICE AND PROCESSING METHOD INCLUDING MODIFICATION ENERGY AND SEPARATION ENERGY

CROSS-REFERENCE TO RELATED APPLICATION

This application claims priority to U.S. Provisional Patent Application No. 63/188,478, filed on May 14, 2021; claims priority from U.S. Provisional Patent Application No. 63/302,974, filed on Jan. 25, 2022; and claims priority from Taiwan Patent Application No. 111117036, filed on May 5, 2022, each of which is hereby incorporated herein by reference in its entireties.

BACKGROUND OF THE INVENTION

1. Field of Invention

The invention relates to a processing device and a processing method, and more particularly to a non-contact processing device and a non-contact processing method.

2. Description of the Related Art

In recent years, due to the continuous flourishing development of semiconductor technology, technological products have leapt forward. In the semiconductor manufacturing process, processing elements are often used to slice, grind or polish materials such as wafer. Semiconductor materials, such as silicon carbide (SiC), have the advantages of wide bandgap properties, high hardness, high thermal conductivity, and chemical inert properties, so they are ideal materials for manufacturing high-temperature electronic components and high-frequency high-power components. However, due to the high hardness of semiconductor materials, it is not easy to carry out processing procedures such as slicing, grinding or polishing, and it will also cause wear to processing elements such as cutter. Therefore, how to improve the processing efficiency and quality of semiconductor materials is one of the current important research and development issues.

SUMMARY OF THE INVENTION

In view of the above, one object or more than one object of the invention is/are to provide a non-contact processing device and a non-contact processing method to solve the above-mentioned problems of the prior art.

In order to achieve the above-mentioned object or objects, the invention provides a non-contact processing device for performing a processing procedure on at least one solid structure, at least comprising: a modification energy source for providing a modification energy to a processing target area of the solid structure in a modification step of the processing procedure to generate qualitative changes or defects in the processing target area of the solid structure to cause the processing target area become a modified layer, wherein the modification energy source is a laser source, the modification energy is a laser energy; and a separation energy source for applying a separation energy on the solid structure with the modified layer in a non-contact manner in a separation step of the processing procedure, thereby separating or thinning the solid structure at the modified layer to cause the solid structure become a separated or thinned solid structure.

Preferably, the separation energy source comprises a microwave or radio-frequency source for providing a microwave or radio-frequency energy as the separation energy.

Preferably, the separation energy source comprises an electrical discharge machining (EDM) unit for providing a discharge energy as the separation energy via at least one discharge electrode.

Preferably, the separation energy source comprises a microwave or radio-frequency source and an electrical discharge machining (EDM) unit for respectively providing a microwave or radio-frequency energy and a discharge energy as the separation energy.

Preferably, further comprising an electric field source, the electric field source providing an electric field to assist the separation energy of the separation energy source in separating or thinning the solid structure at the modified layer to make the solid structure become the separated or thinned solid structure.

Preferably, further comprising a grinding or polishing unit for grinding or polishing the separated or thinned solid structure in a grinding or polishing step of the processing procedure.

Preferably, the grinding or polishing unit is the laser source, an electrical discharge machining (EDM) unit, a microwave or radio-frequency source and/or another microwave or radio-frequency source, thereby respectively providing the laser energy, a discharge energy, a microwave or radio-frequency energy and/or another microwave or radio-frequency energy to grind or polish the separated or thinned solid structure, wherein the separated energy source comprises the electrical discharge machining (EDM) unit and/or the microwave or radio-frequency source.

Preferably, the other microwave or radio-frequency source provides the other microwave or radio-frequency energy via at least one discharge electrode of the electrical discharge machining (EDM) unit.

Preferably, further comprising a heat source for heating the solid structure in the modification step, the separation step and/or a heating step of the processing procedure.

Preferably, the heat source is the laser source, a microwave or radio-frequency source, a hot oil tank, another laser source, another microwave or radio-frequency source and/or an infrared light source, and the separation energy source comprises an electrical discharge machining (EDM) unit and/or the microwave or radio-frequency source.

Preferably, the solid structure is further in contact with a thermal expansion material, the thermal expansion material infiltrates into the modified layer, and the thermal expansion material is caused to expand in volume, thereby separating or thinning the solid structure at the modified layer in the separation step of the processing procedure.

Preferably, the processing target area of the separated or thinned solid structure is provided with a filling material thereon for filling surface cracks on the processing target area of the separated or thinned solid structure.

Preferably, further comprising an external disturbance source, the external disturbance source driving a filling material for filling surface cracks of the separated or thinned solid structure.

Preferably, the filling material is formed on the processing target area of the separated or thinned solid structure by a heat source so as to fill surface cracks on the processing target area of the separated or thinned solid structure.

Preferably, the filling material is formed on the processing target area of the separated or thinned solid structure by a heat source so as to fill surface cracks on the processing target area of the separated or thinned solid structure.

Preferably, the solid structure is immersed in a heated liquid.

Preferably, a direction in which the separation energy source applies the separation energy to the solid structure is different from a direction in which the laser source provides the laser energy to the solid structure.

Preferably, a direction in which the separation energy source applies the separation energy to the solid structure is the same as a direction in which the laser source provides the laser energy to the solid structure.

Preferably, the processing procedure is carried out in a fluid.

Preferably, the processing procedure is carried out in a vacuum environment.

Preferably, a quantity of the discharge electrode of the electrical discharge machining (EDM) unit is one or more than one.

Preferably, a quantity of the solid structure is one or more than one.

In order to achieve the above-mentioned object or objects, the invention further provides a non-contact processing method for performing a processing procedure on at least one solid structure, comprising following steps of: performing a modification step of the processing procedure, the modification step using a modification energy source for providing a modification energy to a processing target area of the solid structure to generate qualitative changes or defects in the processing target area of the solid structure, thereby causing the processing target area becoming a modified layer, wherein the modification energy source is a laser source, the modification energy is a laser energy; and performing a separation step of the processing procedure, the separation step using a separation energy source for applying a separation energy on the solid structure with the modified layer in a non-contact manner, thereby separating or thinning the solid structure at the modified layer and causing the solid structure becoming a separated or thinned solid structure.

Preferably, the separation energy source comprises a microwave or radio-frequency source providing a microwave or radio-frequency energy and/or an electrical discharge machining (EDM) unit providing a discharge energy for applying the separation energy on the solid structure with the modified layer.

Preferably, a first area of the modified layer has a separation origin, and the separation energy is used in the separation step to separate or thin the solid structure from the separation origin of the modified layer.

Preferably, in the separation step, further comprising applying an electric field on the solid structure, thereby assisting the separation energy source in separating or thinning the solid structure at the modified layer.

Preferably, in the separation step, further comprising causing a thermal expansion material infiltrating into the modified layer of the solid structure and expanding a volume of the thermal expansion material, thereby assisting the separation energy source in separating or thinning the solid structure at the modified layer.

Preferably, after performing the separation step, further comprising performing a grinding or polishing step of the processing procedure for grinding or polishing the separated or thinned solid structure by using a grinding or polishing unit.

Preferably, in or after performing the modification step, the separation step and/or the grinding or polishing step, further comprising performing a heating step of the processing procedure for heating the solid structure.

Preferably, further comprising performing a filling step for filling surface cracks on the processing target area of the separated or thinned solid structure.

Preferably, in the processing procedure, further comprising performing a subsequent step on the separated or thinned solid structure, the subsequent step is selected from a group consisting of coating step, vapor deposition step, lithography step, photolithography step, etching step and diffusion step.

Preferably, the processing target area is located on partial areas of the solid structure.

In summary, based on the above, the non-contact processing device and the non-contact processing method of the invention can have one or more than one of the following advantages:

(1) The invention utilizes the electromagnetic radiation source in the modification step to generate qualitative changes or defects in the processing target area of the solid structure, thereby generating differences in stress, structural strength, lattice pattern or hardness between the processing target area and other areas. The invention is capable of rapidly separating or thinning the solid structure by virtue of differences in stress, structural strength, lattice pattern or hardness in the separation step.

(2) In the separation step of the invention, the separation energy is applied to the solid structure that produces the modification phenomenon, due to differences in stress, structural strength, lattice pattern or hardness, and differences in response to the separation energy source between the modified layer and other areas, the solid structure is separated or thinned at the modified layer.

(3) In the invention, the solid structure is heated by the heat source to increase a temperature of the solid structure, and an absorption rate of the radiation source energy can be increased by increasing a temperature of the solid structure.

(4) The invention is capable of detecting a formation state of the modified layer of the solid structure, thereby the laser energy provided by the laser source can be fed back and controlled and/or the microwave or radio-frequency energy provided by the microwave or radio-frequency source can be fed back and controlled, such as control of magnitude, frequency or processing feeding speed of the microwave or radio-frequency energy provided by the microwave or radio-frequency source.

(5) The invention is capable of speeding up a separation speed of the solid structure, and also capable of filling the surface cracks on the processing target area, thereby preventing expansion of the superfluous surface cracks.

(6) By performing the processing procedure in the heated liquid tank, the invention is capable of reducing unwanted cracks or transferring of cracks caused by thermal shock, and preventing the unwanted surface cracks from expanding.

In order to enable the examiner to have a further understanding and recognition of the technical features of the invention and the technical efficacies that can be achieved, preferred embodiments in conjunction with detailed explanation are provided as follows.

BRIEF DESCRIPTION OF THE DRAWINGS

FIGS. 7a and 7b are schematic diagrams of the modification and separation steps performed by the non-contact processing device of the invention, wherein FIG. 7a shows two kinds of separation energy being provided to the solid structure from a same side, and FIG. 7b shows two kinds of separation energy being provided to the solid structure from a vertical side.

DETAILED DESCRIPTION OF THE INVENTION

Figure 1:
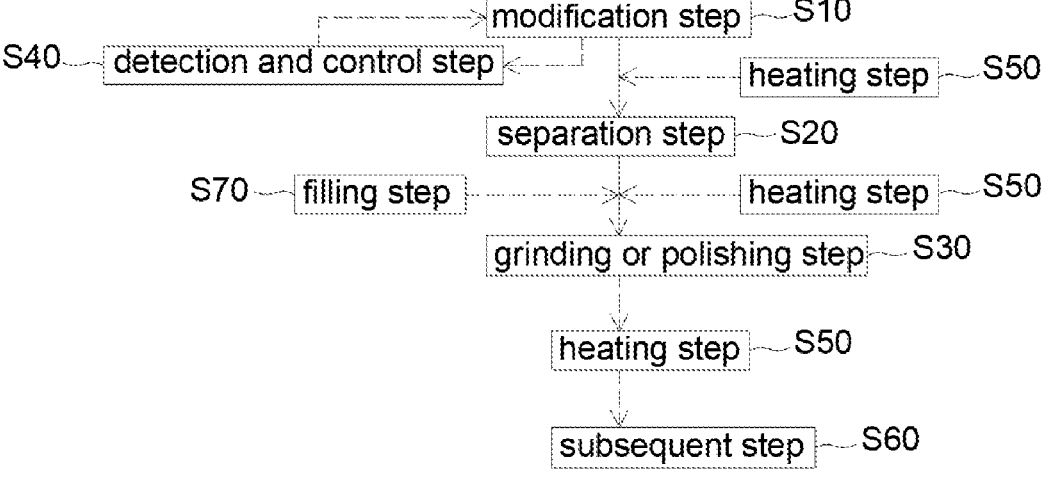
FIG. 1 is a flow chart of a processing procedure of a non-contact processing method of the invention.

In order to understand the technical features, content and advantages of the invention and its achievable efficacies, the invention is described below in detail in conjunction with the figures, and in the form of embodiments, the figures used herein are only for a purpose of schematically supplementing the specification, and may not be true proportions and precise configurations after implementation of the invention; and therefore, relationship between the proportions and configurations of the attached figures should not be interpreted to limit the scope of the claims of the invention in actual implementation. In addition, in order to facilitate understanding, the same elements in the following embodiments are indicated by the same referenced numbers. And the size and proportions of the components shown in the drawings are for the purpose of explaining the components and their structures only and are not intending to be limiting.

Unless otherwise noted, all terms used in the whole descriptions and claims shall have their common meaning in the related field in the descriptions disclosed herein and in other special descriptions. Some terms used to describe in the present invention will be defined below or in other parts of the descriptions as an extra guidance for those skilled in the art to understand the descriptions of the present invention.

The terms such as "first", "second", "third" used in the descriptions are not indicating an order or sequence, and are not intending to limit the scope of the present invention. They are used only for differentiation of components or operations described by the same terms.

Moreover, the terms "comprising", "including", "having", and "with" used in the descriptions are all open terms and have the meaning of "comprising but not limited to".

The invention provides a non-contact processing device and a non-contact processing method, the non-contact processing device and the non-contact processing method are used for performing a processing procedure on a solid structure to be processed (i.e., an object to be processed), and are applicable to various different semiconductor manufacturing processes, such as, but not limited to SOI (silicon-on-insulator) semiconductor manufacturing process, ingot slicing process, wafer thinning process or packaging process. The solid structure is, for example, but not limited to, solid objects containing semiconductor materials in the above-mentioned semiconductor manufacturing process, such as wafer or ingot crystal structure. Wherein, the above-mentioned semiconductor materials are, for example, but not limited to, substrate materials such as Si, SiC, SiGe, Ge, GaAs, GaN, or InP, and the crystal structure is, for example, but not limited to, monocrystalline, polycrystalline or amorphous structure. The processing procedure performed by the non-contact processing method of the invention at least comprises: performing a modification step and performing a separation step. Wherein, in the modification step, using a modification energy source for providing a modification energy to a processing target area of the solid structure for generating qualitative changes or defects in the processing target area of the solid structure and causing the processing target area becoming a modified layer, wherein the modification energy source is a laser source, the modification energy is a laser energy. Wherein, in the separation step, using a separation energy source for applying a separation energy on the solid structure with the modified layer in a non-contact manner, thereby separating or thinning the solid structure at the modified layer and causing the solid structure becoming a separated or thinned solid structure.

The above-mentioned "separation or thinning" of the solid structure refers to, for example, removing, separating, cutting, splitting, or slicing a part of a material or a sheet-like structure from the solid structure to be processed, wherein the part of the material or the sheet-like structure can be optionally recycled or reused. In other words, the solid structure after separation or thinning can be a single processed structure (that is, a first half structure described later) or two processed structures (that are, the first half structure and a second half structure described later). The processing target area can be located at any depth or located on a surface (not limited to a front surface or a back surface) of the solid structure. Therefore, a thickness of the separated or thinned solid structure (i.e., a thickness of the first half structure/the second half structure) of the invention can be adjusted and changed according to process requirements of practical applications, and the invention is not limited to a specific thickness.

As shown in FIG. 1, in a modification step S10 of the processing procedure of the invention, the non-contact processing device of the invention using the modification energy source for providing the modification energy to the processing target area of the solid structure, causing qualitative changes or defects in the processing target area of the solid structure, that is, forming the modified layer. In a separation step S20 of the processing procedure of the invention, the invention using the separation energy source for applying the separation energy on the solid structure with the modified layer in a non-contact manner, thereby separating or thinning the solid structure at the modified layer and causing the solid structure becoming the separated or thinned solid structure.

Wherein, after performing the separation step S20, the invention is capable of further optionally performing a grinding or polishing step S30 for grinding or polishing the separated or thinned solid structure (for example, a first half structure 100a and/or a second half structure 100b) with a grinding or polishing unit. In addition, when performing the modification step S10, the invention is capable of further optionally performing a detection and control step S40 at the same time, detecting and feeding back and controlling a formation state of a modified layer instantaneously. Moreover, in or after performing the modification step S10, the separation step S20 and/or the grinding or polishing step S30, the invention is capable of further optionally performing a heating step S50, heating the solid structure with a heat source to be capable of reducing material brittleness and reducing roughness of a cut or thinned surface of the solid structure. After performing the separation step S20 or the grinding or polishing step S30, the invention can even further comprise performing one subsequent step S60 or a plurality of subsequent steps S60, the subsequent step S60 is selected from, for example, a group consisting of coating step, vapor deposition step, lithography step, photolithography step, etching step and diffusion step.

Figure 2A:
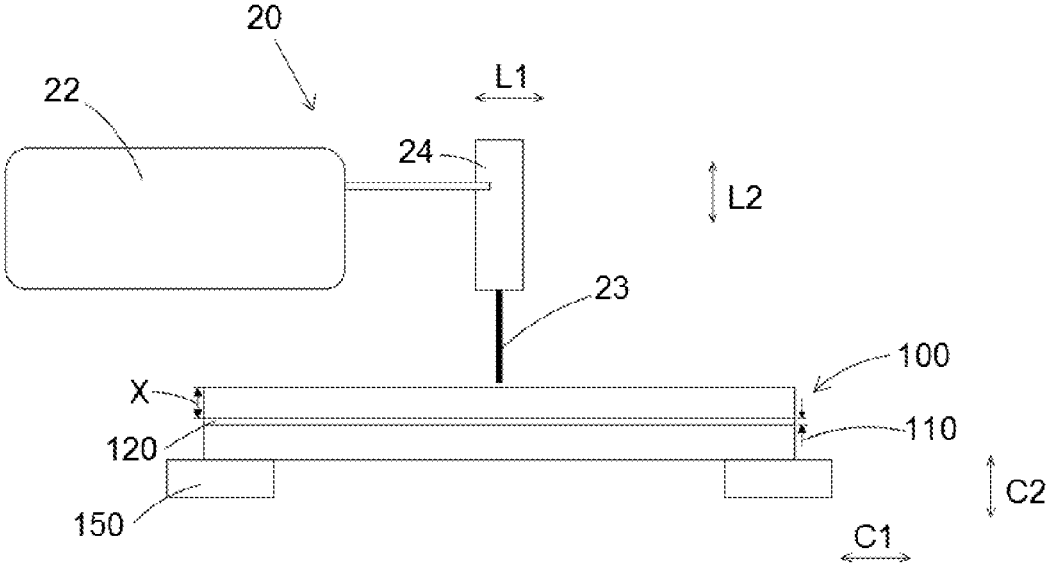
FIG. 2a is a schematic diagram of a modification step performed by a non-contact processing device of the invention.
Figure 2B:
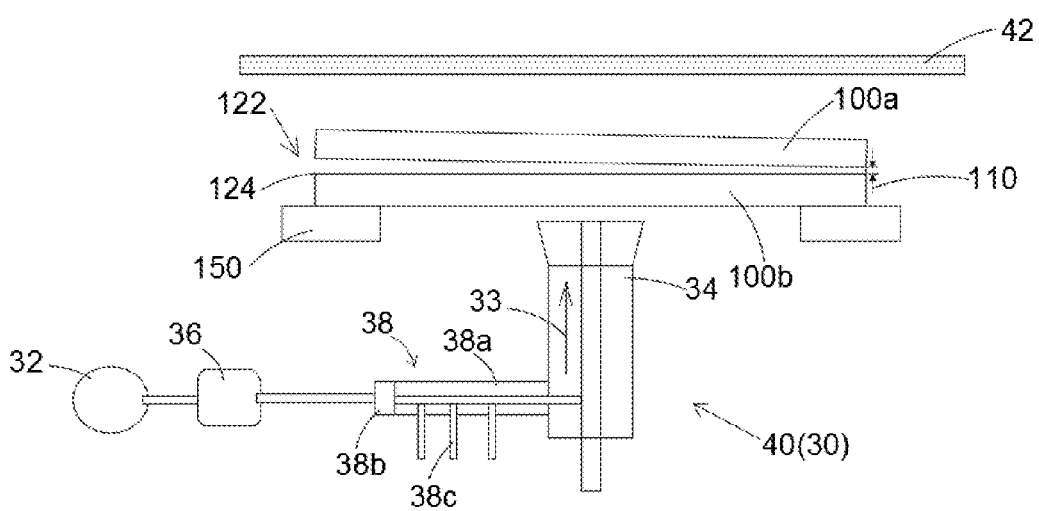
FIG. 2b is a schematic diagram of a separation step performed by the non-contact processing device of the invention.
Figure 3:
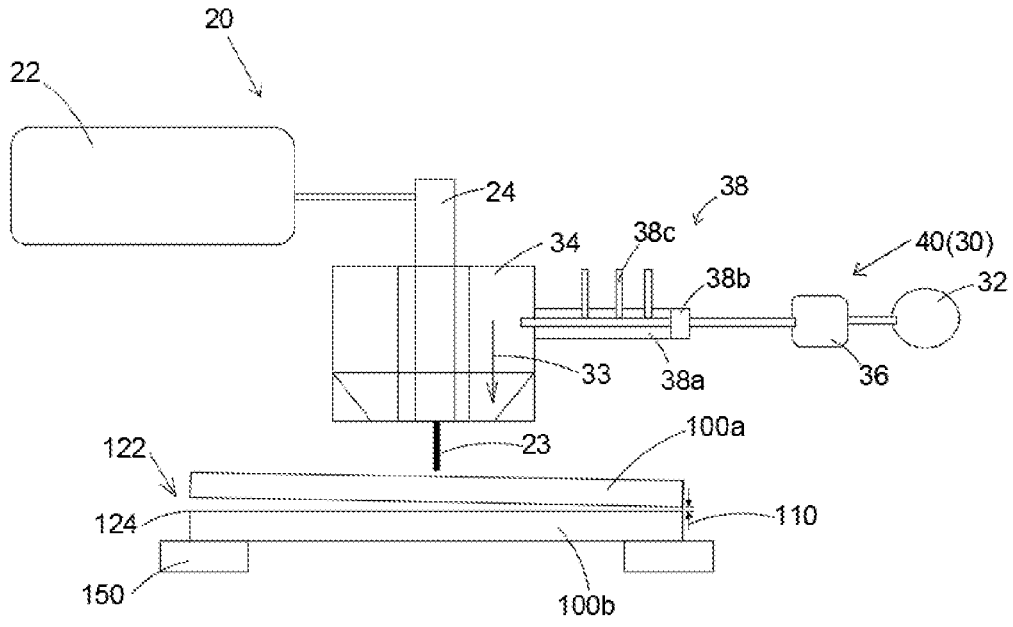
FIG. 3 is a schematic diagram of the modification and separation steps performed by the non-contact processing device of the invention, wherein a modification energy and a separation energy are provided to a solid structure from a same side.
Figure 4:
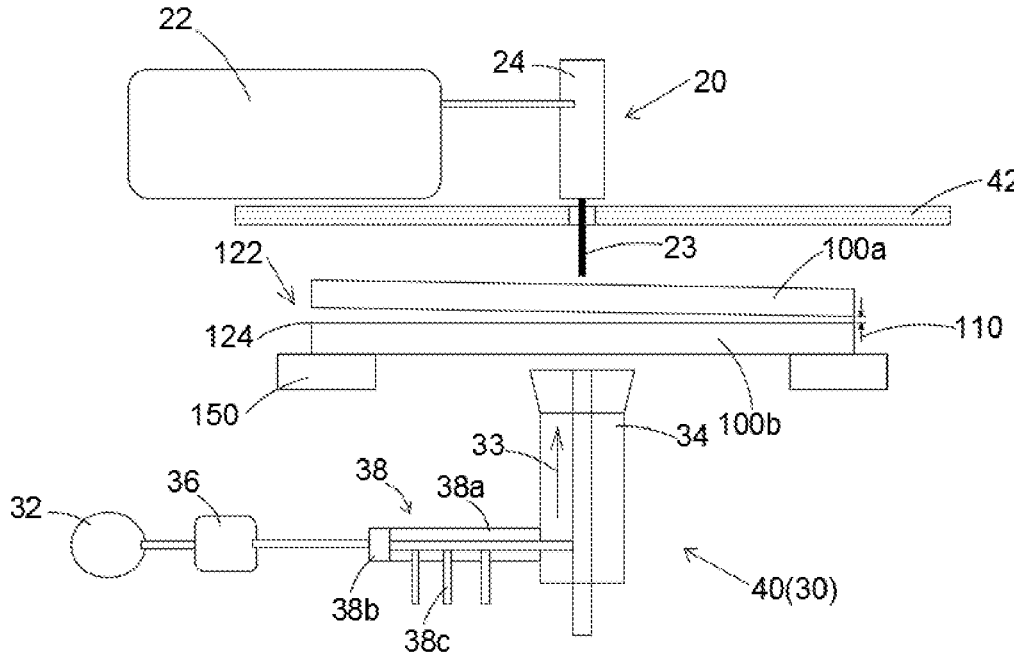
FIG. 4 is a schematic diagram of the modification and separation steps performed by the non-contact processing device of the invention, wherein the modification energy and the separation energy are provided to the solid structure from opposite sides.
Figure 5:
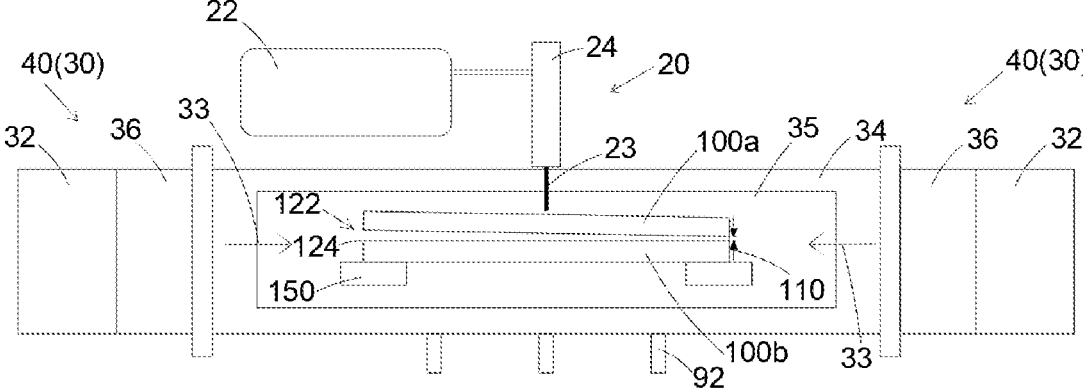
FIG. 5 is a schematic diagram of the modification and separation steps performed by the non-contact processing device of the invention, wherein the modification energy and the separation energy are provided to the solid structure from a vertical side.
Figure 8:
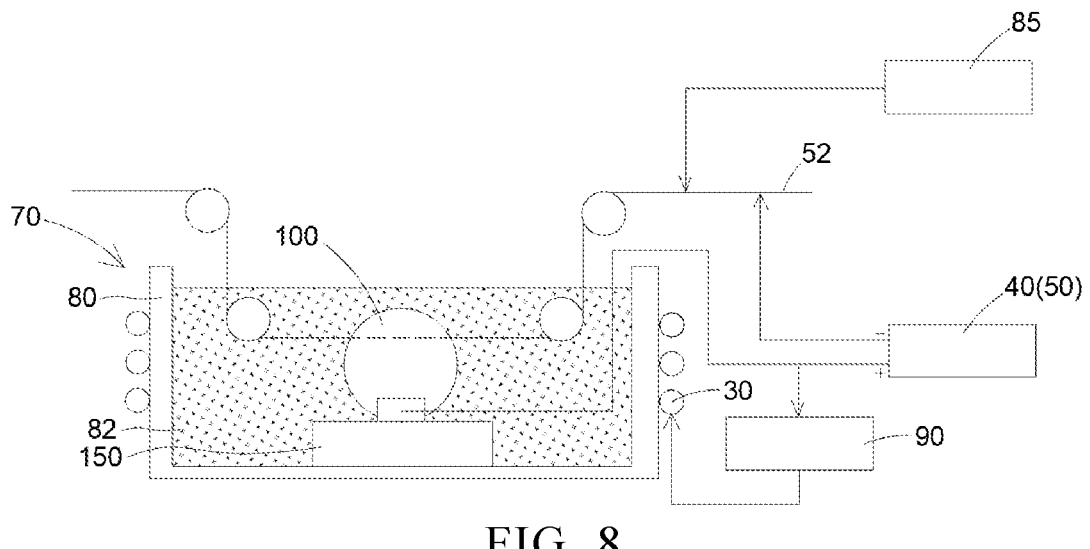
FIG. 8 is a schematic diagram of the separation step and a heating step performed by the non-contact processing device of the invention.

Please refer to FIG. 1 and FIG. 2a, in the modification step S10 of the non-contact processing device and the non-contact processing method of the invention, using the modification energy source (such as an electromagnetic radiation source) for providing the modification energy to a processing target area 110 of a solid structure 100 to cause qualitative changes or defects in the solid structure 100 to form the modified layer 120, as shown in FIG. 2a. The solid structure 100 as a wafer is used as an example, the wafer is defined with the processing target area 110 located in a radial section or an axial section of the wafer, the radial section or the axial section can be, for example, in any depth or on a surface of the wafer. The solid structure 100 is carried, for example, on a carrier 150, the carrier 150 is, for example, but not limited to, a movable carrier. In addition, the processing procedure of the solid structure 100 is not limited to being performed in a chamber such as a heated liquid tank 80 (as shown in FIG. 8) or not being performed in a chamber (as shown in FIGS. 3 to 5).

A first electromagnetic radiation source provides a first electromagnetic energy to the processing target area 110 of the solid structure 100 so as to cause the solid structure 100 at the processing target area 110 to generate a modification phenomenon, such as qualitative changes or defects, for example, weakened atomic bond, weakened structure, or monocrystalline state transformed into polycrystalline state or amorphous state, that is, a modified layer 120 is formed. A thickness of the solid structure 100 is, for example, but not limited to, in a range of about 50 μm to about 1,800 The processing target area 110 is, for example, located in a depth X or on a surface of the solid structure 100. Wherein area and thickness of the modified layer 120 formed in the solid structure 100 in the invention are not particularly limited, they can be determined according to actual manufacturing process requirements.

The electromagnetic radiation source used in the invention is, for example, a laser source 20, which generates a pulsed light with a laser energy (modification energy) in the modification step S10 of the processing procedure for irradiating the processing target area 110 of the solid structure 100. Taking a thickness of the solid structure 100 as 1,800 μm as an example, the depth X of the processing target area 110 can be in a range of between about 0 μm and about 1,800 μm. Likewise, a distance between a focal point of the pulsed light and the carrier 150 can range from about 1,800 μm to about 0 μm depending on an actual manufacturing process. The laser source 20 generates a pulsed light 23 through a laser generator 22, and the pulsed light 23 is transmitted onto the solid structure 100 through a lens set 24. Since the pulsed light 23 of the laser source 20 will form a non-linear absorption effect and generate a thermal effect at a focal point to form a hot spot, the solid structure 100 at the focal point will be ionized to generate free electrons, and energy of the free electrons will also be transferred to the solid structure 100 at the focal point to increase a temperature of the solid structure 100 at the focal point, that is, an absorption coefficient of the focal point will be increased to absorb more of the laser energy provided by the laser source 20, thereby increasing a modification effect. Therefore, when the focal point of the pulsed light 23 generated by the laser source 20 is focused on the processing target area 110 of the solid structure 100, the laser energy will be provided for the processing target area 110 of the solid structure 100 to generate a modification phenomenon, such as qualitative changes or defects, for example, weakened atomic bond, weakened structure, or monocrystalline state transformed into polycrystalline state or amorphous state, or decrease in hardness, thereby forming the modified layer 120.

The laser source 20 used in the invention is, for example, but not limited to, Nd:YAG pulsed laser, Nd:YVO4 pulsed laser or Ti-Sapphire pulsed laser. The pulsed light 23 generated by the laser source 20 scans and irradiates the processing target area 110 of the solid structure 100, so that a defect density is in a range of about 100 ea/mm$^2$ to about 1,000,000 ea/mm$^2$, wherein a moving speed of the pulsed light 23 is in a range of about 10 mm/sec to about 1,000 mm/sec, a wavelength of the pulsed light 23 is greater than about 700 nm, a wavelength of the pulsed light 23 is preferably in a range of about 700 nm to about 1,600 nm, a pulse width is less than about 1,000 ns, a repetition frequency is in a range of about 5 KHz to about 10 MHz, a pulse energy (E) is, for example, in a range of about 0.1 μJ to about 1,000 μJ, and a spot diameter is, for example, in a range of about 1 μm to about 50 μm.

Figure 12A:
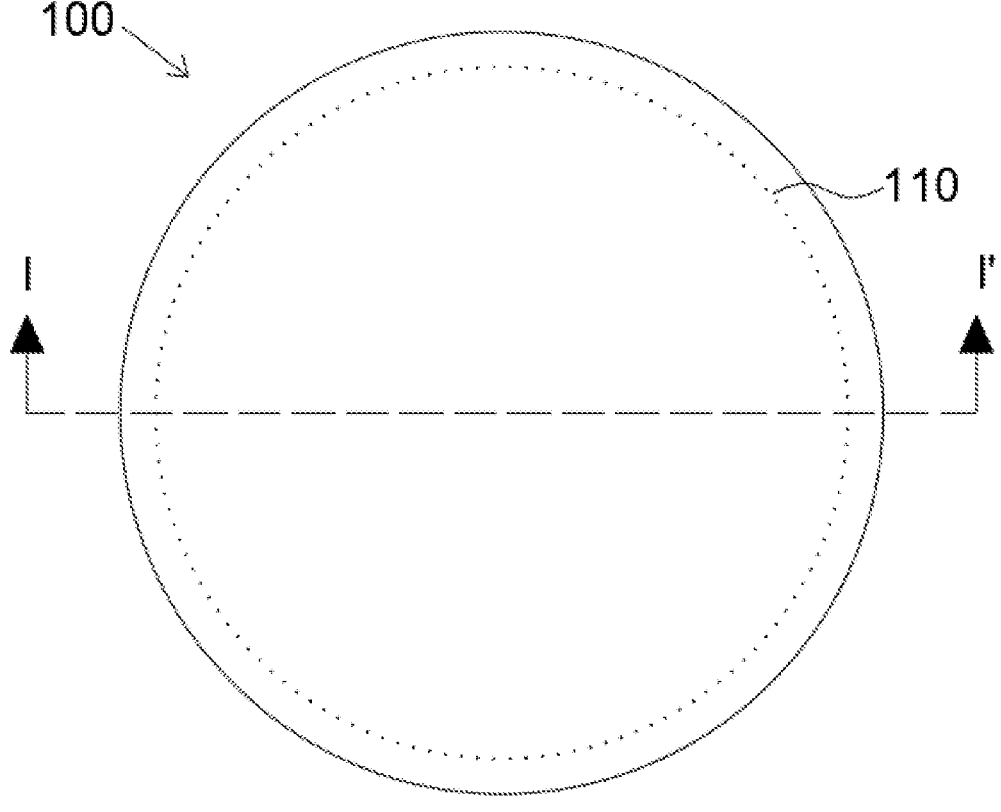
FIGS. 12a and 12b are respectively a top view and a cross-sectional side view of the solid structure of the invention having a single processing target area located in a partial area.
Figure 12B:
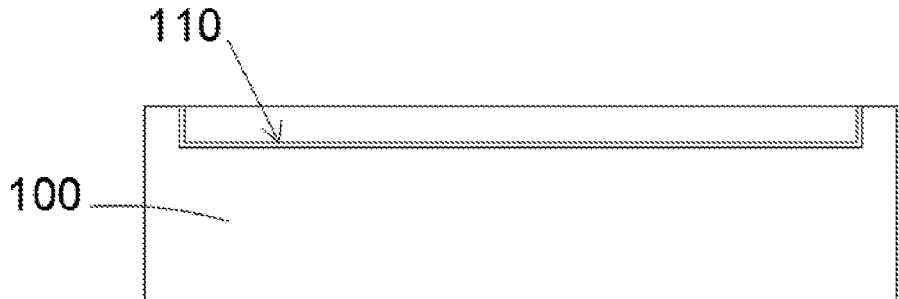
Figure 12C:
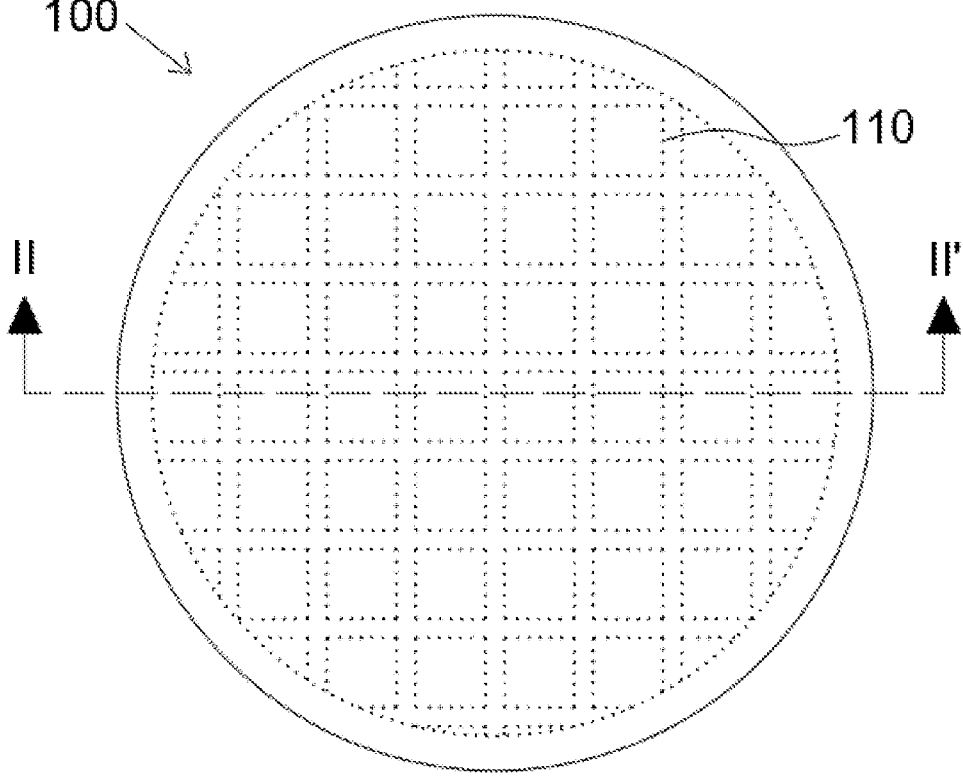
FIGS. 12c and 12d are respectively a top view and a cross-sectional side view of the solid structure of the invention having a plurality of processing target areas located in partial areas.
Figure 12D:
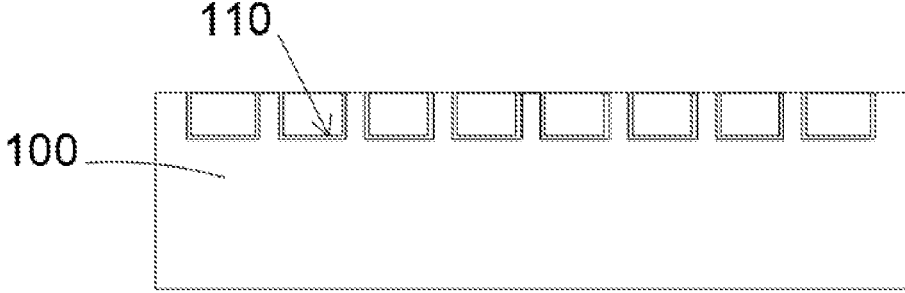

The invention can use a movable carrier to move the solid structure 100 horizontally (as shown by the horizontal double arrow C1 at a bottom of FIG. 2*a*) or the horizontally movable pulsed light 23 output by the laser source 20 (as shown by the horizontal double arrow L1 at a top of FIG. 2*a*), so that the processing target area 110 of the solid structure 100 is horizontally scanned and irradiated by the pulsed light 23. In addition, the invention can also, for example, utilize a movable carrier to move the solid structure 100 vertically (i.e., the laser source 20 is fixed longitudinally and the carrier is movable longitudinally, as indicated by the vertical double arrow C2 at a bottom of FIG. 2*a*) or the vertically movable pulsed light 23 output by the laser source 20 (that is, the laser source 20 is movable longitudinally, and the carrier is fixed longitudinally, as shown by the vertical double arrow L2 at a top of FIG. 2*a*), so that the processing target area 110 of the solid structure 100 is vertically scanned and irradiated by the pulsed light 23. In addition, in other embodying modes, a moving mode of the above-mentioned movable carrier is not limited to vertically moving or horizontally moving the solid structure 100, the movable carrier can also, for example, move the solid structure 100 in a rotating, inclined or other manner, that is, as long as a position where a focal point of the pulsed light 23 irradiating the solid structure 100 can be adjusted, any moving mode is applicable to the invention. In addition, by being capable of adjusting a position where a focal point of the pulsed light 23 irradiates the solid structure 100, the processing target area 110 of the solid structure 100 is not limited to be fully distributed in an entire area of the solid structure 100, for example, only distributed in a part of the radial section and/or longitudinal section. For example, the processing target area 110 (as shown in FIGS. 12*a* and 12*b*) or the processing target areas 110 (as shown in FIGS. 12*c* and 12*d*) can be located in a partial area or in partial areas of the solid structure 100, a cross-sectional shape of the processing target area 110 is not particularly limited, it can be determined according to actual requirements. For example, it can be U-shaped as shown in FIG. 12*a* to FIG. 12*d*, wherein FIG. 12*b* is a cross-sectional side view taken along the section line I-I' in FIGS. 12*a*, and 12*d* is a cross-sectional side view taken along the section line II-II' in FIG. 12*c*.

Figure 10A:
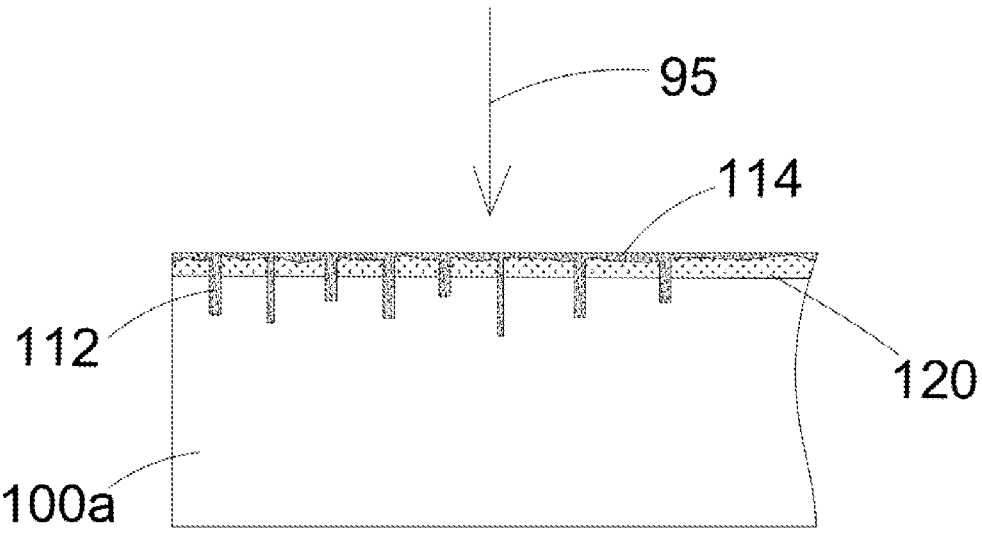
FIGS. 10a and 10b are schematic diagrams of a filling step performed by the non-contact processing device of the invention.
Figure 10B:
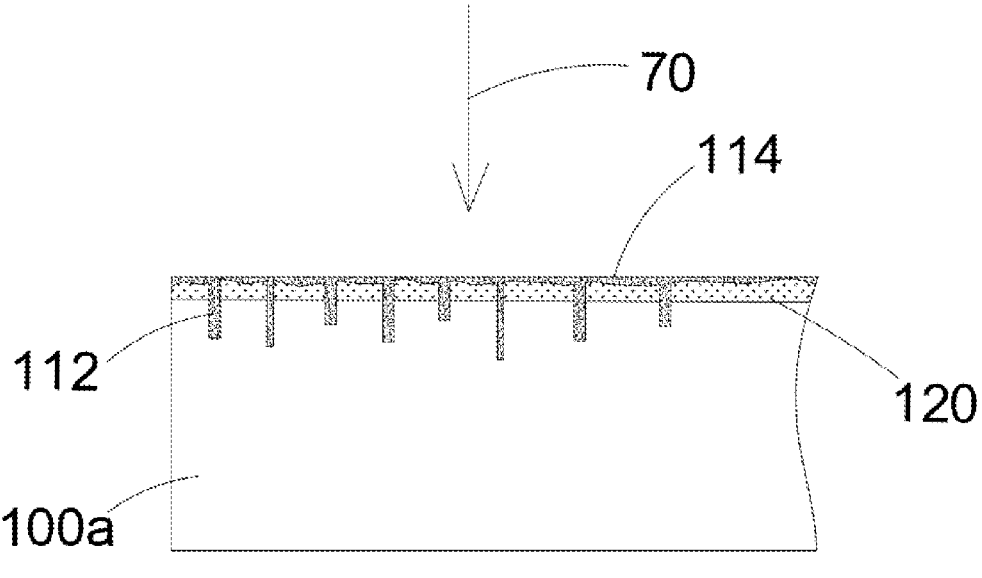

Please refer to FIG. 1, FIG. 2*b*, and FIGS. 3 to 5, the non-contact processing device and the non-contact processing method of the invention further comprise performing the separation step S20 of the processing procedure, wherein in the separation step 20, using a separation energy source 40 for applying a separation energy on the solid structure 100 with the modified layer 120 in a non-contact manner, thereby separating or thinning the solid structure 100 at the modified layer 120 and causing the solid structure 100 becoming a separated or thinned solid structure, for example, the first half-structure 100*a* with a thinned plane, or the first half-structure 100*a* and the second half-structure 100*b* respectively with a separated plane. In addition, the separated or thinned solid structure (i.e., the first half structure 100*a* and/or the second half structure 100*b*) can also have a part of the modified layer 120 (as shown in FIG. 7*c*, FIG. 10*a* or FIG. 10*b*).

The separation energy source 40 used in the invention, for example, comprises a microwave or radio-frequency source 30. The microwave or radio-frequency source 30 outputs a microwave or radio-frequency electromagnetic wave to provide a microwave or radio-frequency energy to serve as the separation energy so as to utilize differences in stress, structural strength, lattice pattern or hardness between the modified layer 120 (i.e., the processing target area 110) and other areas (i.e., non-processing target areas), and differences in response to the microwave or radio-frequency energy, thereby separating or thinning the solid structure 100 at the modified layer 120 and causing the solid structure 100 becoming the separated or thinned solid structure (e.g., the first half structure 100*a*, or the first half structure 100*a* and the second half structure 100*b*). A stress (such as compressive stress or tensile stress) of the modified layer 120 of the processing target area 110 of the solid structure 100 of the invention is different from that of other areas (non-processing target areas), or a structural strength of the modified layer 120 is weaker than that of other areas (non-processing target areas), or a lattice pattern (such as monocrystalline, polycrystalline or amorphous) of the modified layer 120 is different from that of other areas (non-processing target areas), or a hardness of the modified layer 120 is weaker than that of other areas (non-processing target areas). The invention is capable of increasing differences between the modified layer 120 and the non-processing target areas by differences in microwave energy absorption between the modified layer 120 and the non-processing target areas, and capable of easily expanding a degree of separation at the modified layer 120. In addition, a conductivity of the modified layer 120 is better than that of other areas (non-processing target areas), so the separation energy source 40 can also be an electrical discharge machining (EDM) unit (as shown in FIG. 8). In addition, by means of differences in response to a discharge energy between the modified layer 120 and other areas, the solid structure 100 can be separated or thinned at the modified layer 120.

The microwave or radio-frequency source 30 generates a microwave 33 through a microwave generator 32 (such as a magnetron) and transmits the microwave 33 to the solid structure 100 through a coaxial resonator 34. Wherein, an isolator 36 is preferably provided between the microwave generator 32 and the coaxial resonator 34, which is capable of providing an effect of unidirectional transmission of the microwave 33, and a matcher 38 is further preferably provided on a transmission path of the microwave 33 (such as the coaxial resonator 34), which is capable of reducing an amount of microwave reflection, so that the microwave 33 is capable of effectively entering the coaxial resonator 34 and thereby being transmitted onto the solid structure 100. The matcher 38 is composed of, for example, a coaxial tube 38*a*, a metal plate 38*b* and a metal rod 38*c*, but a structure of the microwave or radio-frequency source 30 described above is only a preferred example and is not intended to limit the invention. Compared with ultraviolet light or infrared light, the microwave or radio-frequency electromagnetic wave provided by the microwave or radio-frequency source 30 is capable of penetrating the solid structure 100 such as a wafer/an ingot, so the separation energy can be effectively transmitted to a depth at which the modified layer 120 is located. Since the modified layer 120 of the processing target area 110 of the solid structure 100 has a modification phenomenon such as qualitative changes or defects, there will be differences in absorbing the microwave or radio-frequency energy provided by the microwave or radio-frequency source 30, wherein the microwave or radio-frequency energy is capable of making bonds between atoms (e.g., silicon atoms) of the solid structure 100 to generate vibration and heat up, so by means of differences in stress, structural strength, lattice pattern and/or hardness between the modified layer 120 and the other non-process- ing target areas, the solid structure 100 can be separated or thinned at the modified layer 120. In addition, the invention is not limited to applying the separation energy on the modified layer 120 of the solid structure 100 after the entire processing target area 110 of the solid structure 100 is formed with the modified layer 120. That is, regardless of whether the processing target area 110 of the solid structure 100 is partially or entirely formed with the modified layer 120, the invention can apply the separation energy on the modified layer 120 of the solid structure 100. In other words, the modification step S10 and the separation step S20 of the processing procedure of the invention can be performed in sequence, for example, the modification step S10 is used to form the modified layer 120 in the entire processing target area 110, and then the separation step S20 is performed. The modification step S10 and the separation step S20 can also be performed at the same time, for example, while the modification step S10 is used to form the modified layer 120 in the processing target area 110 partially, the separation step S20 can be performed simultaneously so as to partially or completely separate or thin the solid structure 100.

If the modification step S10 and the separation step S20 are performed in sequence, the invention can perform the modification step S10 first, the processing target area 110 of the solid structure 100 is capable of becoming the modified layer 120 by the laser energy provided by the laser source 20, and then the separation step S20 is performed, that is, the microwave or radio-frequency source 30 is used to provide the microwave or radio-frequency energy as the separation energy, thereby separating or thinning the solid structure 100 at the modified layer 120 and causing the solid structure 100 to become the separated or thinned solid structure.

If the modification step S10 and the separation step S20 are performed simultaneously, the invention can, for example, form the modified layer 120 and simultaneously separate or thin the solid structure 100 at the modified layer 120. Wherein the laser energy provided by the laser source 20 is capable of making the processing target area 110 of the solid structure 100 generate free electrons, compared with other areas (non-processing target areas), generation of the free electrons is capable of absorbing more microwave energy to increase a temperature of the processing target area 110, and increase in temperature is conducive to the processing target area 110 absorbing more of the laser energy to generate more free electrons, thereby absorbing more of the electromagnetic energy provided by the micro- wave or radio-frequency source 30 to form a forward cycle. Since the processing target area 110 of the solid structure 100 (i.e., a position where the modified layer 120 is located) has more free electrons at the focal point of the pulsed light 23 of the laser source 20, a temperature is higher, and an absorption coefficient is higher, compared with other areas (non-processing target areas), the processing target area 110 is capable of absorbing more microwave energy, thus gen- erating a greater thermal difference between the processing target area 110 and the other non-processing target areas, thereby generating more differences in stress, structural strength, lattice pattern or hardness between the processing target area 110 and the other areas (non-processing target areas), which is conducive to an effect of separating or thinning the solid structure 100. Wherein, the above-men- tioned temperature can be detected by, for example, a temperature sensor 92 (e.g., an infrared temperature sensor). In addition, the laser source 20 of the invention provides the laser energy by generating the pulsed light 23, and the microwave or radio-frequency source 30 provides the micro- wave or radio-frequency energy by continuously or inter- mittently generating the microwave or radio-frequency elec- tromagnetic wave. Thereby, the laser source 20 and the microwave or radio-frequency source 30 of the invention are capable of respectively outputting the pulsed light 23 and the microwave or radio-frequency electromagnetic wave in sequence or simultaneously to provide the laser energy and the microwave or radio-frequency energy, so that the pro- cessing target area 110 of the solid structure 100 is capable of becoming the modified layer 120, and the solid structure 100 can be separated or thinned at the modified layer 120.

Figure 6:
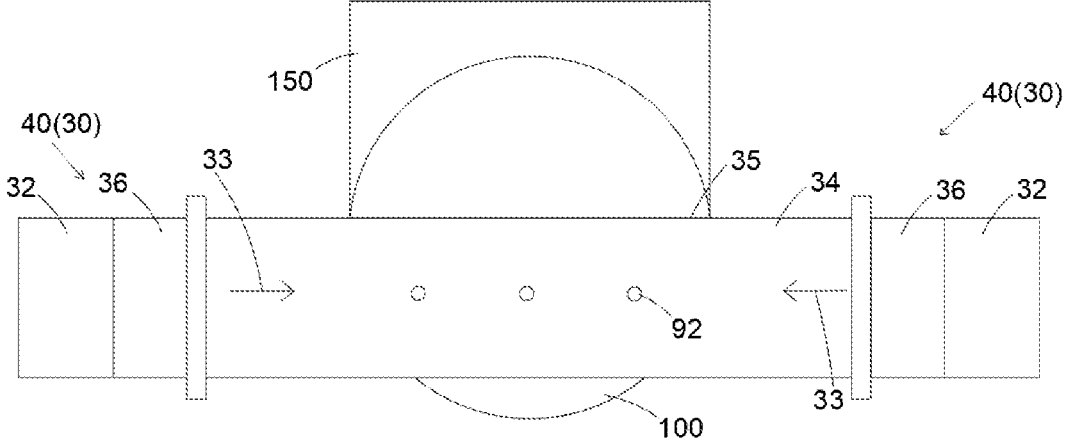
FIG. 6 is a schematic diagram viewed from another angle of FIG. 5.
Figure 11:
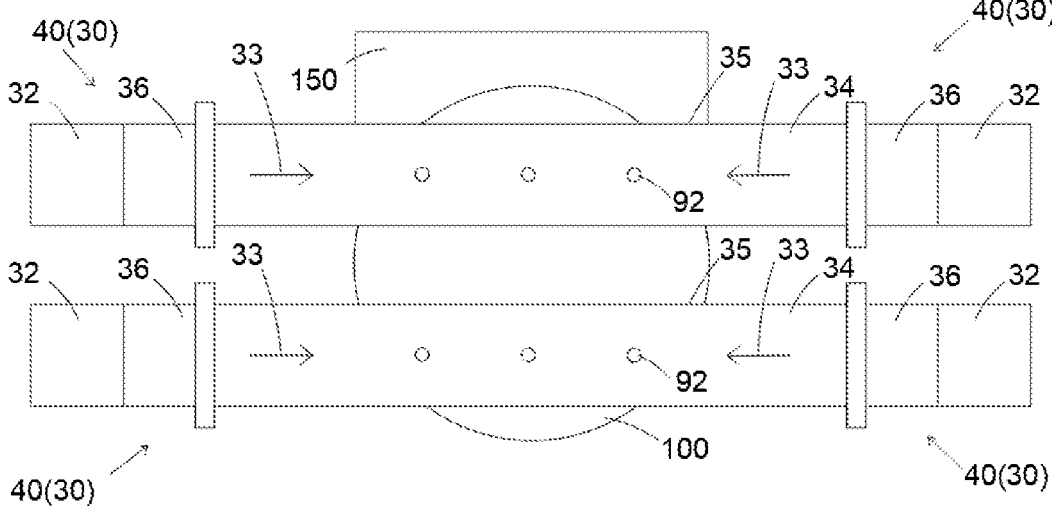
FIG. 11 is a schematic diagram of two sets of dual microwave or radio-frequency sources used in the non-contact processing device of the invention.

In addition, a direction in which the microwave or radio- frequency source 30 of the invention outputs the microwave or radio-frequency electromagnetic wave to provide the microwave or radio-frequency energy to the solid structure 100 is not particularly limited, the microwave or radio- frequency electromagnetic wave can be provided in a direc- tion different from (an opposite side as shown in FIG. 4), the same as (a same side as shown in FIG. 3) or perpendicular to (as shown in FIG. 5 and FIG. 6) a direction in which the laser source 20 provides the laser energy to the solid structure 100. In the invention, one set of the dual micro- wave or radio-frequency sources 30 can also be used to provide the microwave or radio-frequency energy, as shown in FIG. 5 and FIG. 6, the two microwave or radio-frequency sources 30 of one set of the dual microwave or radio- frequency sources 30 share the same coaxial resonator 34 and are respectively disposed on left and right sides of the solid structure 100, and the microwave or radio-frequency energy is provided in a direction perpendicular to a direction in which the laser source 20 provides the laser energy. Wherein the coaxial resonator 34 shown in FIGS. 5 and 6 can be further optionally provided with an opening 35, so that the carrier 150 is capable of using the opening 35 to send areas to be processed on the solid structure 100 into the coaxial resonator 34. In addition, as shown in FIG. 11, an additional set of dual microwave or radio-frequency sources 30 can also be added, thereby increasing a processing (e.g., separation) effect. Furthermore, in addition to the aforemen- tioned opposite side direction, same side direction, and perpendicular direction, an included angle can be between a direction in which the microwave or radio-frequency source 30 provides the microwave or radio-frequency energy and a direction in which the laser source 20 provides the laser energy, and the included angle ranges from about 0 degree to about 180 degrees. In addition, a direction in which the microwave or radio-frequency source 30 provides the micro- wave or radio-frequency energy can also be adjusted, for example, a direction in which the microwave or radio- frequency source 30 provides the microwave or radio- frequency energy and a direction in which the laser source 20 provides the laser energy and/or the included angle can be adjusted according to surface topography or composition of the solid structure 100.

For example, the pulsed light 23 provided by the laser source 20 is capable of scanning along a direction of the radial section or the axial section of a crystal structure such as a wafer or an ingot to provide the modification energy to the solid structure 100, and a direction of distribution of qualitative changes or defects of the solid structure 100 is parallel to a direction of the radial section or the axial section, wherein a scanning path of the pulsed light 23 along a direction of the radial section or the axial section is not particularly limited, any scanning path can be applicable to the invention as long as the laser energy can be provided to the processing target area 110 of the solid structure 100. Since the microwave 33 or the radio-frequency electromagnetic wave are capable of penetrating the solid structure 100 such as a wafer/an ingot, a direction in which the microwave 33 or the radio-frequency electromagnetic wave provided by the microwave or radio-frequency source 30 can be parallel to a direction of the radial section or the axial section, or perpendicular to a direction of the radial section or the axial section, or can be provided in other directions, and only the processing target area 110 (i.e., the modified layer 120) of the solid structure 100 that generates qualitative changes or defects will absorb more of the microwave or radio-frequency energy than non-processing target areas. Wherein, no matter which direction the microwave or radio-frequency source 30 provides the microwave 33 or the radio-frequency electromagnetic wave, an absorption element 42 can be disposed on an opposite side to avoid unnecessary scattering and improve an uniformity of absorption (as shown in FIG. 4). Taking the microwave or radio-frequency source 30 as a microwave source as an example, a wavelength range of the microwave 33 of the invention is about 1 mm to about 1 m, a frequency range is about 300 GHz to about 0.3 GHz, and a power range is, for example, about 200 watts to about 5,000 watts. The laser energy output by the laser source 20 of the invention is not limited to be higher than, lower than or equal to the microwave or radio-frequency energy output by the microwave or radio-frequency source 30. Since configuration and operation principles of the laser source 20 and the microwave or radio-frequency source 30 are well known to a person having ordinary skill in the art, no further description will be given in the invention herein.

Figure 7A:
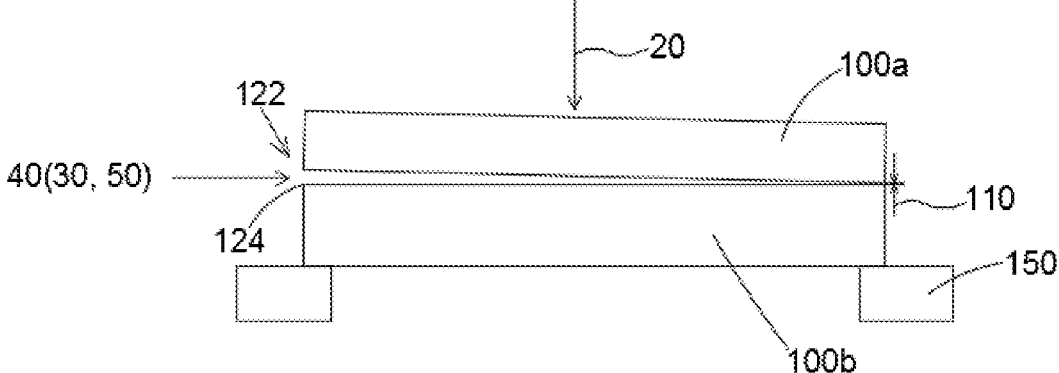
Figure 7B:
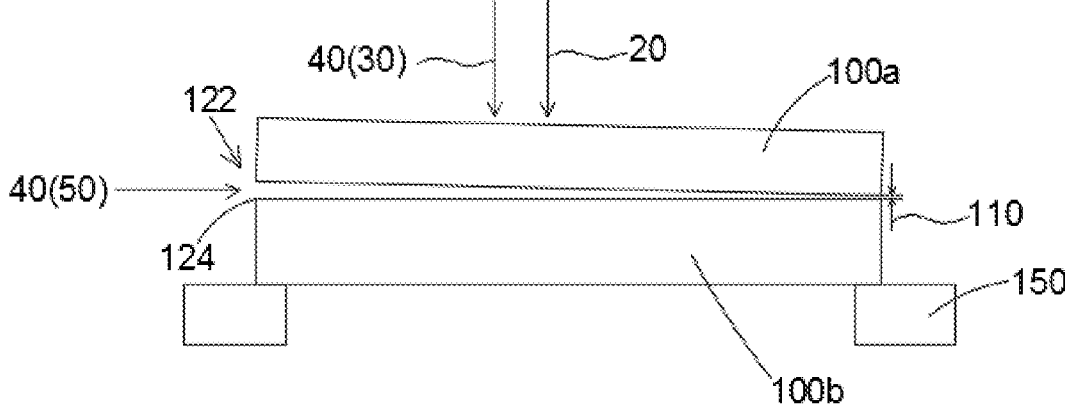
Figure 7C:
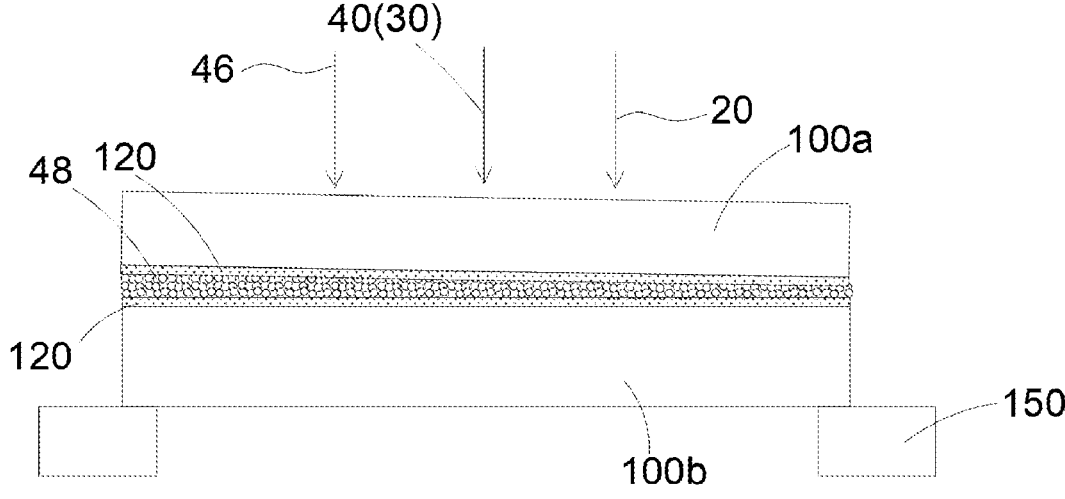
FIG. 7c is a schematic diagram of the non-contact processing device of the invention using an electric field source or a thermal expansion material to assist in separating or thinning the solid structure.

In addition, as shown in FIG. 7a and FIG. 8, the separation energy source 40 of the invention can also be, for example, an electrical discharge machining (EDM) unit 50 to replace the microwave or radio-frequency source 30, for providing a discharge energy as the separation energy through a discharge electrode 52 in a non-contact manner. Alternatively, as shown in FIG. 7b and FIG. 8, the invention can also use the electrical discharge machining (EDM) unit 50 and the microwave or radio-frequency source 30 as the separation energy source 40 at the same time, wherein directions in which the separation energy provided by the electrical discharge machining (EDM) unit 50 and the microwave or radio-frequency source 30 can be, for example, the same (as shown in FIG. 7a), perpendicular to each other (as shown in FIG. 7b), or at an included angle between about 0 degree and about 180 degrees. Wherein, the discharge electrode 52 of the electrical discharge machining (EDM) unit 50 is, for example, a wire electrode or a plate electrode, and materials of the wire electrode and the plate electrode can be, for example, molybdenum, brass, tungsten, and zinc coated (galvanized), a diameter of the wire electrode ranges from about 30 μm to about 300 and a thickness of the plate electrode ranges from about 30 μm to about 300 The electrical discharge machining (EDM) unit 50 serving as the separation energy source 40 is conducive to separation (cutting, slicing) or thinning of the solid structure 100 such as a wafer (as shown in FIGS. 7a to 7b) or an ingot (as shown in FIG. 8). Moreover, hardness or structural strength of the modified layer 120 of the processing target area 110 of the solid structure 100 is lower than that of other areas, which is conducive to the discharge energy of the electrical discharge machining (EDM) unit 50 quickly removing the modified layer 120, thereby rapidly separating or thinning the solid structure 100 at the modified layer 120. For example, the invention can apply the discharge energy to a separation origin 124 of a first area 122 of the modified layer 120 of the solid structure 100 by the electrical discharge machining (EDM) unit 50, thereby separating or thinning the solid structure 100 from the separation origin 124 of the modified layer 120. Since a stress (such as compressive stress or tensile stress) of the modified layer 120 in the processing target area 110 of the solid structure 100 is different from that of other areas (non-processing target areas), a degree of separation can be easily expanded (as shown in FIGS. 7a and 7b) at the separation origin 124 of the modified layer 120. In other words, the invention is not only capable of speeding up a separation speed, but also capable of reducing a service power of the electrical discharge machining (EDM) unit 50. Since operation principles, operation mode and structure of the electrical discharge machining (EDM) unit 50 are well known to a person having ordinary skill in the art, and are not an emphasis of the invention, no further description will be given in the invention herein.

Figure 13A:
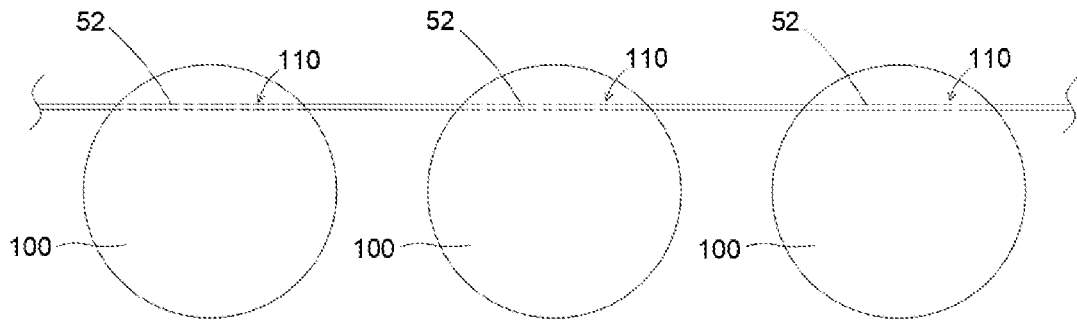
FIG. 13a is a schematic diagram of separating the solid structures by an electrical discharge machining (EDM) unit with a single discharge electrode of the invention.
Figure 13B:
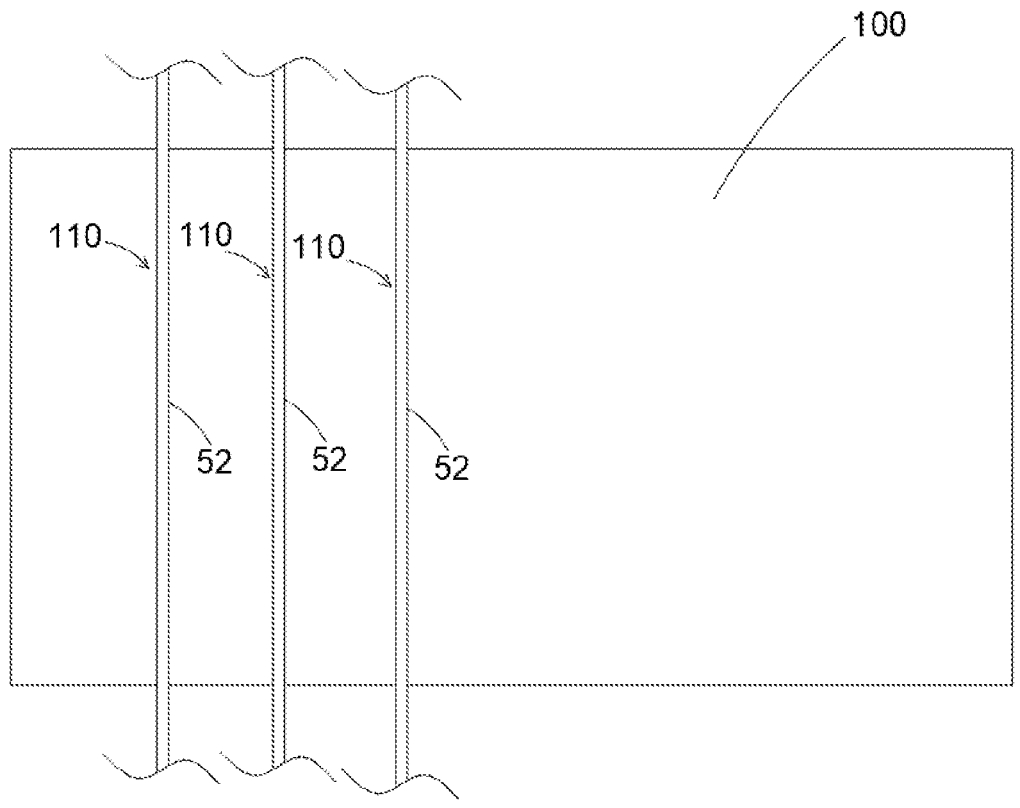
FIG. 13b is a schematic diagram of separating the solid structure by the electrical discharge machining (EDM) unit with the discharge electrodes of the invention.
Figure 13C:
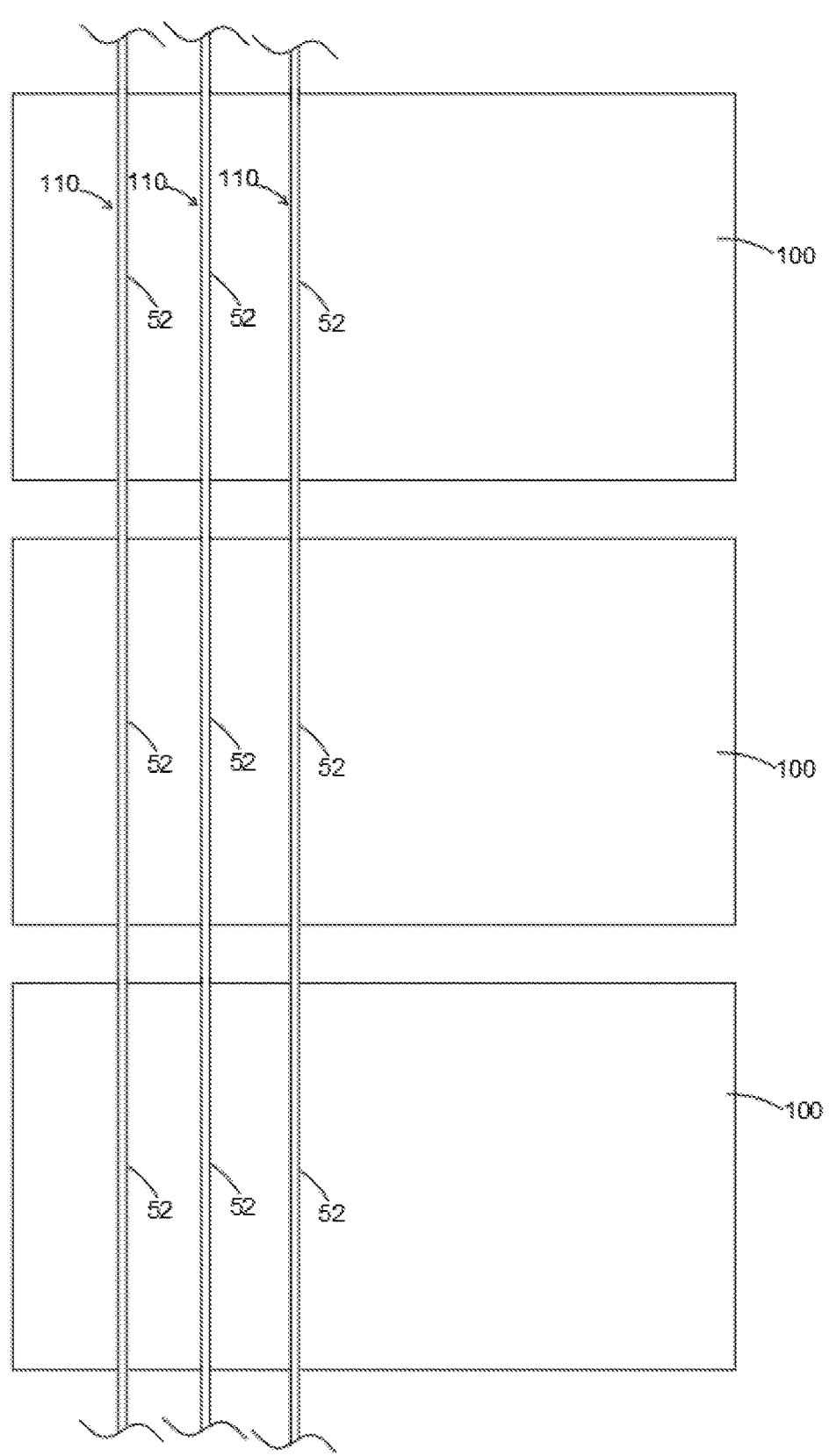
FIG. 13c is a schematic diagram of separating the solid structures by the electrical discharge machining (EDM) unit with the discharge electrodes of the invention, wherein a view angle of FIG. 13a is the same as that of FIG. 8, an ingot is used as an object to be processed, and a view angle of FIG. 13a is perpendicular to FIGS. 13b and 13c.

Although the invention is illustrated by performing the separation step S20 on the solid structure 100 (i.e., a single object to be processed) by the electrical discharge machining (EDM) unit 50 with the discharge electrode 52 (single conductive structure) as an example, as shown in FIG. 8, the invention is not limited thereto. The discharge electrode 52 of the invention, for example, can also perform the separation step S20 on the solid structures 100 (i.e., a plurality of objects to be processed) at the same time, as shown in FIG. 13a, that is, the discharge electrode 52 is capable of separating the solid structures 100 at the same time. Likewise, the invention can also perform the separation step S20 on the solid structure 100 (as shown in FIG. 13b) or the solid structures 100 (as shown in FIG. 13c) with the separated discharge electrodes 52 (a plurality of conductive structures) at the same time. Moreover, the separation step S20 of the invention is not limited to be performed in the above-mentioned liquid or gaseous fluid, the separation step S20 of the invention can also be performed in a vacuum environment. In other words, in the separation step S20 of the invention, in addition to the discharge electrode 52 being capable of wet-separating the solid structure 100 (that is, performing in a liquid tank or the heated liquid tank 80), the discharge electrode 52 is also capable of dry-separating the solid structure 100 (that is, performing in air or in a vacuum environment). Wherein, in the invention, in a process of dry-separating the solid structure 100 by the discharge electrode 52, the discharge electrode 52 can also be optionally cooled, for example, a cooling fluid such as liquid or gas is used to cool down or maintain a temperature of the discharge electrode 52, alternatively, the discharge electrode 52 can also be heated by the discharge energy, that is, without using a cooling fluid such as liquid or gas. For the same reason, each step of the processing procedure of the invention, such as the modification step S10 or the separation step S20, as well as the later-described grinding or polishing step S30, a filling step S70 or the heating step S50, can be optionally performed in the above-mentioned liquid or gaseous fluid or in a vacuum environment.

As shown in FIG. 7c, the non-contact processing device of the invention can optionally comprise an electric field source 46, wherein in the separation step S20, the electric field source 46 providing an electric field on the modified layer 120 of the solid structure 100, enabling free electrons to accumulate at an interface between the modified layer 120 and the solid structure 100, thereby assisting the separation energy source 40 in separating or thinning the solid structure

100 at the modified layer 120, causing the solid structure 100 becoming the separated or thinned solid structure. Wherein a direction of the electric field is not limited, as long as free electrons can be accumulated at the interface between the modified layer 120 and the solid structure 100, any direction can be applied to the invention.

In addition, as shown in FIG. 7c, before performing the separation step S20, the invention is also capable of optionally contacting the solid structure 100 with the modified layer 120 with a thermal expansion material 48, for example, immersing the solid structure 100 in the thermal expansion material 48 (e.g. water) to enable the thermal expansion material 48 to infiltrate into holes or cracks of the modified layer 120. Alternatively, in the invention, the thermal expansion material 48 can be directly filled in the holes or cracks of the modified layer 120, wherein the thermal expansion material 48 is, for example, a liquid such as an aqueous solution or a gas such as water vapor, or even a mixture of liquid and gas. Therefore, when the separation energy/heat energy is subsequently applied to the solid structure 100 with the modified layer 120 by the separation energy source 40 (and a subsequent heat source 70), the thermal expansion material 48 will heat up and expand or boil due to absorption of the separation energy/heat energy, causing the solid structure 100 to crack at the modified layer 120, so the thermal expansion material 48 of the invention is capable of assisting the separation energy source 40 in separating or thinning the solid structure 100 at the modified layer 120.

In addition, as shown in FIG. 8, the non-contact processing device of the invention can further optionally comprise, for example, another microwave or radio-frequency source 85. The other microwave or radio-frequency source 85 is capable of providing another microwave or radio-frequency energy to the solid structure 100, for example, along a direction of the modified layer 120, via the discharge electrode 52 of the electrical discharge machining (EDM) unit 50. Wherein, the other microwave or radio-frequency source 85 can be used in the separation step S20 as a separation energy source to speed up a separation speed, and can also be applied in the later-mentioned grinding or polishing step S30 as a grinding or polishing unit to reduce surface roughness of a cut or thinned surface of the separated or thinned solid structure, or can be used as a heating unit in the heating step S50 to increase a temperature of the solid structure 100. By increasing a temperature of the solid structure 100, an energy absorption rate of the radiation source can be improved, and a discharge processing efficiency can be improved. In addition, the electrical discharge machining (EDM) unit 50 of the invention is capable of simultaneously providing the discharge energy and the other microwave or radio-frequency energy through the discharge electrode 52 so as to simultaneously exert separation, grinding or polishing, and heating effects, for example. The electrical discharge machining (EDM) unit 50 of the invention is also capable of providing the discharge energy and the other microwave or radio-frequency energy through the discharge electrode 52 non-simultaneously so as to exert, for example, separation, grinding, polishing, or heating effects, respectively.

Figure 9A:
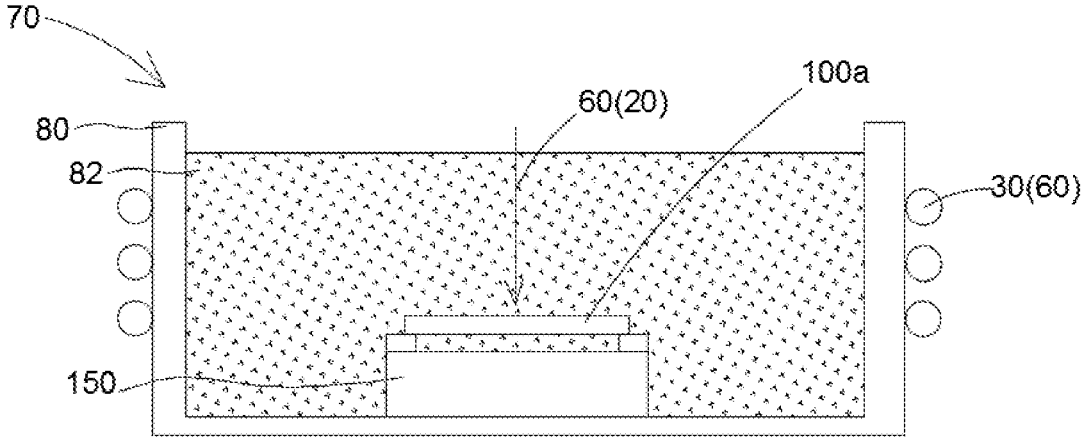
FIG. 9a is a schematic diagram of the non-contact processing device of the invention performing a grinding or polishing step in a heated liquid tank.
Figure 9B:
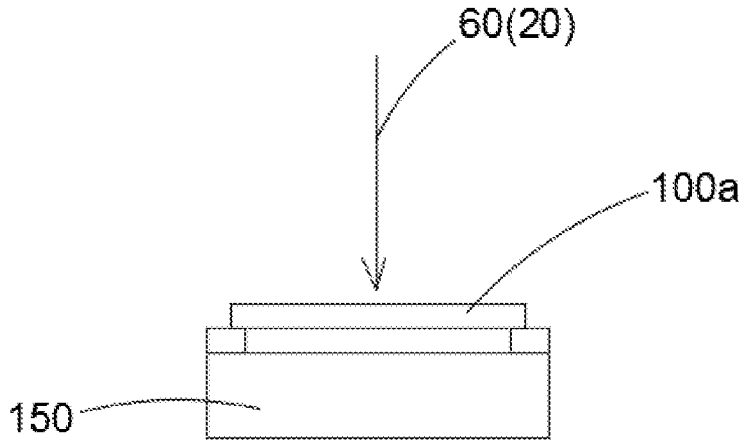
FIG. 9b is a schematic diagram of the non-contact processing device of the invention performing the grinding or polishing step not in a heated liquid tank.

In addition, as shown in FIG. 9a and FIG. 9b, the non-contact processing device of the invention further optionally comprises, for example, a grinding or polishing unit 60 for grinding or polishing the separated or thinned solid structure in the grinding or polishing step S30 of the processing procedure, so that a surface roughness of a cut or thinned surface of the separated or thinned solid structure is reduced, for example, from a range of about 30 μm to about 1 μm to a range of about 10 μm to about 0.05 Wherein the grinding or polishing unit 60 can be, for example, the laser source 20 shown in FIGS. 3 to 5 and FIGS. 9a and 9b, the electrical discharge machining (EDM) unit 50 shown in FIGS. 7a, 7b and 8, the microwave or radio-frequency source 30 shown in FIGS. 3 to 5 and FIGS. 7a, 7b and FIGS. 8 to 9a and/or the other microwave or radio-frequency source 85 shown in FIG. 8 so as to utilize the laser energy, the discharge energy or the microwave or radio-frequency energy to grind or polish the separated or thinned solid structure (e.g., the first half structure 100a or the first half structure 100a and the second half structure 100b) in order to reduce a surface roughness of a cut or thinned surface of the separated or thinned solid structure.

In addition, as shown in FIG. 8 to FIG. 9a, the non-contact processing device of the invention further optionally comprises, for example, a heat source 70 for performing the heating step S50 for heating the solid structure 100 in or after performing the modification step S10, the separation step S20 and/or the grinding or polishing step S30 of the processing procedure. In FIG. 8, the solid structure 100 is exemplified as an ingot, and in FIG. 9a, the separated or thinned solid structure is exemplified as a wafer. Wherein the heat source 70 is, for example, the laser source 20 shown in FIGS. 3 to 5, 7a, 7b and 9a, the microwave or radio-frequency source 30 shown in FIGS. 3 to 5 and 7a, 7b and 8 to 9a, the heated liquid tank 80 shown in FIGS. 8 to 9a, another laser source, the other microwave or radio-frequency source 85, and/or an infrared light source. Wherein, the heated liquid tank 80 serving as the heat source 70 has a heated liquid 82, preferably a hot oil, more preferably a high-temperature resistant oil, such as fluorinated oil, and in all or part of the steps of the processing procedure, the solid structure 100 can be immersed in the heated liquid 82 to be capable of reducing unnecessary cracks or crack expansion caused by thermal shock. Wherein, in the separation step S20, if the heat source 70 is used to heat the solid structure 100 at the same time, a temperature of the solid structure 100 can be increased, and heating can generate more free electrons on the modified layer 120; compared with other areas (non-processing target areas), generation of the free electrons is capable of absorbing more microwave energy to increase a temperature of the modified layer 120 of the processing target area 110, and increase in temperature is conducive to the modified layer 120 absorbing more of the laser energy to generate more free electrons, thereby absorbing more of the electromagnetic energy provided by the microwave or radio-frequency source 30 to form a forward cycle.

In addition, as shown in FIG. 8, the non-contact processing device of the invention further optionally comprises, for example, a detection and control unit 90 for detecting a formation state of the modified layer 120 of the solid structure 100 in the detection and control step S40 of the processing procedure, for example, by detecting an amount of free electrons, photoconductivity attenuation changes and defect generation state can be known, thereby the laser energy provided by the laser source 20 can be fed back and controlled and/or the microwave or radio-frequency energy provided by the microwave or radio-frequency source 30 can be fed back and controlled, such as control of magnitude, frequency or processing feeding speed of the microwave or radio-frequency energy provided by the microwave or radio-frequency source 30. Wherein, the detection and control step S40 can be performed at the same time when the modification step S10, the separation step S20 and/or the grinding or polishing step S30 are performed, for example.

In addition, when the separation step S20 is performed, surface cracks 112 with different depths will be generated around the processing target area 110 of the solid structure 100 (cut or thinned surfaces). Therefore, the invention is capable of further optionally performing a filling step S70, for example, using an external disturbance source 95 (as shown in FIG. 10*a*), such as an ultrasonic unit being used for providing an ultrasonic wave to drive a filling material 114 to fill the surface cracks 112 on cut or thinned surfaces of the processing target area 110 to prevent the unwanted surface cracks 112 from expanding continuously, which can not only strengthen its structure, but also achieve an efficacy of swiftly (even speeding up) performing the separation step S20. A composition of the filling material 114 can be, for example, Si, SiC, SiGe, Ge, GaAs, GaN, or InP, but not limited thereto, any material suitable for filling cracks, such as filler or glue, can be applied in the invention. A frequency range of the ultrasonic wave is, for example, but not limited to, about 15 KHz to about 30 KHz. The filling step S70 can be optionally performed in a fluid, for example, the fluid is a conductive medium such as the heated liquid 82, water or air, and the ultrasonic wave can generate fluid droplets and shock pressure waves in the fluid, causing material particles of the filling material 114 to be embedded in the surface cracks 112 on cut or thinned surfaces of the processing target area 110. In addition, the invention is not limited to an ultrasonic unit with a specific structure, and a direction in which the ultrasonic unit provides ultrasonic waves is not particularly limited, as long as an effect of filling can be achieved, any ultrasonic unit and any direction are applicable to the invention.

In addition, in the invention, the surface of the separated or cut solid structure (for example, the first half structure 100*a*) or the surface of the modified layer 120 thereof can be oxidized or chemically reacted by the heat energy provided by the heat source 70 to form the filling material 114 such as silicon oxide or oxide as shown in FIG. 10*b* in order to fill the surface cracks 112 and prevent the surface cracks 112 from transferring and expanding.

In summary, based on the above, the non-contact processing device and the non-contact processing method of the invention can have one or more than one of the following advantages:

(1) The invention utilizes the electromagnetic radiation source in the modification step to generate qualitative changes or defects in the processing target area of the solid structure, thereby generating differences in stress, structural strength, lattice pattern or hardness between the processing target area and other areas. The invention is capable of rapidly separating or thinning the solid structure by virtue of differences in stress, structural strength, lattice pattern or hardness in the separation step.

(2) In the separation step of the invention, the separation energy is applied to the solid structure that produces the modification phenomenon, due to differences in stress, structural strength, lattice pattern or hardness, and differences in response to the separation energy source between the modified layer and other areas, the solid structure is separated or thinned at the modified layer.

(3) In the invention, the solid structure is heated by the heat source to increase a temperature of the solid structure, and an absorption rate of the radiation source energy can be increased by increasing a temperature of the solid structure.

(4) The invention is capable of detecting a formation state of the modified layer of the solid structure, thereby the laser energy provided by the laser source can be fed back and controlled and/or the microwave or radio-frequency energy provided by the microwave or radio-frequency source can be fed back and controlled, such as control of magnitude, frequency or processing feeding speed of the microwave or radio-frequency energy provided by the microwave or radio-frequency source.

(5) The invention is capable of speeding up a separation speed of the solid structure, and also capable of filling the surface cracks on the processing target area, thereby preventing expansion of the superfluous surface cracks.

(6) By performing the processing procedure in the heated liquid tank, the invention is capable of reducing unwanted cracks or transferring of cracks caused by thermal shock, and preventing the unwanted surface cracks from expanding.

Note that the specification relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. A non-contact processing device for performing a processing procedure on at least one solid structure, at least comprising:

a modification energy source for providing a modification energy to a processing target area of the solid structure in a modification step of the processing procedure to generate qualitative changes or defects in the processing target area of the solid structure to cause the processing target area become a modified layer, wherein the modification energy source is a laser source, the modification energy is a laser energy; and a separation energy source for applying a separation energy on the solid structure with the modified layer in a non-contact manner in a separation step of the processing procedure, thereby separating or thinning the solid structure at the modified layer to cause the solid structure become a separated or thinned solid structure, wherein the separation energy source comprises an electrical discharge machining (EDM) unit for providing a discharge energy as the separation energy via at least one discharge electrode.

2. The non-contact processing device as claimed in claim 1, wherein the separation energy source comprises a microwave or radio-frequency source and the electrical discharge machining (EDM) unit for respectively providing a microwave or radio-frequency energy and the discharge energy as the separation energy.

3. The non-contact processing device as claimed in claim 1, further comprising an electric field source, the electric field source providing an electric field to assist the separation energy of the separation energy source in separating or thinning the solid structure at the modified layer to make the solid structure become the separated or thinned solid structure.

4. The non-contact processing device as claimed in claim 1, further comprising a grinding or polishing unit for grinding or polishing the separated or thinned solid structure in a grinding or polishing step of the processing procedure.

5. The non-contact processing device as claimed in claim 4, wherein the grinding or polishing unit is the laser source, the electrical discharge machining (EDM) unit, a microwave or radio-frequency source and/or another microwave or radio-frequency source, thereby respectively providing the laser energy, the discharge energy, a microwave or radio-frequency energy and/or another microwave or radio-frequency energy to grind or polish the separated or thinned solid structure, wherein the separation energy source comprises the electrical discharge machining (EDM) unit and the microwave or radio-frequency source.

6. The non-contact processing device as claimed in claim 5, wherein the other microwave or radio-frequency source provides the other microwave or radio-frequency energy via the discharge electrode of the electrical discharge machining (EDM) unit.

7. The non-contact processing device as claimed in claim 1, further comprising a heat source for heating the solid structure in the modification step, the separation step and/or a heating step of the processing procedure.

8. The non-contact processing device as claimed in claim 7, wherein the heat source is the laser source, a microwave or radio-frequency source, a hot oil tank, another laser source, another microwave or radio-frequency source and/or an infrared light source, and the separation energy source comprises the electrical discharge machining (EDM) unit and the microwave or radio-frequency source.

9. The non-contact processing device as claimed in claim 1, wherein the solid structure is further in contact with a thermal expansion material, the thermal expansion material infiltrates into the modified layer, and the thermal expansion material is caused to expand in volume, thereby separating or thinning the solid structure at the modified layer in the separation step of the processing procedure.

10. The non-contact processing device as claimed in claim 1, wherein the processing target area of the separated or thinned solid structure is provided with a filling material thereon for filling surface cracks on the processing target area of the separated or thinned solid structure.

11. The non-contact processing device as claimed in claim 10, wherein the filling material is formed on the processing target area of the separated or thinned solid structure by a heat source so as to fill surface cracks on the processing target area of the separated or thinned solid structure.

12. The non-contact processing device as claimed in claim 1, further comprising an external disturbance source, the external disturbance source driving a filling material for filling surface cracks of the separated or thinned solid structure.

13. The non-contact processing device as claimed in claim 1, wherein the solid structure is immersed in a heated liquid.

14. The non-contact processing device as claimed in claim 1, wherein a direction in which the separation energy source applies the separation energy to the solid structure is different from a direction in which the laser source provides the laser energy to the solid structure.

15. The non-contact processing device as claimed in claim 1, wherein a direction in which the separation energy source applies the separation energy to the solid structure is the same as a direction in which the laser source provides the laser energy to the solid structure.

16. The non-contact processing device as claimed in claim 1, wherein the processing procedure is carried out in a fluid.

17. The non-contact processing device as claimed in claim 1, wherein the processing procedure is carried out in a vacuum environment.

18. The non-contact processing device as claimed in claim 1, wherein a quantity of the discharge electrode of the electrical discharge machining (EDM) unit is more than one.

19. The non-contact processing device as claimed in claim 1, wherein a quantity of the solid structure is one or more than one.

20. A non-contact processing method for performing a processing procedure on at least one solid structure, comprising following steps of:

performing a modification step of the processing procedure, the modification step using a modification energy source for providing a modification energy to a processing target area of the solid structure to generate qualitative changes or defects in the processing target area of the solid structure, thereby causing the processing target area becoming a modified layer, wherein the modification energy source is a laser source, the modification energy is a laser energy; and performing a separation step of the processing procedure, the separation step using a separation energy source for applying a separation energy on the solid structure with the modified layer in a non-contact manner, thereby separating or thinning the solid structure at the modified layer and causing the solid structure becoming a separated or thinned solid structure, wherein the separation energy source comprises an electrical discharge machining (EDM) unit for providing a discharge energy as the separation energy via at least one discharge electrode.

21. The non-contact processing method as claimed in claim 20, wherein the separation energy source comprises a microwave or radio-frequency source providing a microwave or radio-frequency energy and the electrical discharge machining (EDM) unit providing the discharge energy for applying the separation energy on the solid structure with the modified layer.

22. The non-contact processing method as claimed in claim 20, wherein a first area of the modified layer has a separation origin, and the separation energy is used in the separation step to separate or thin the solid structure from the separation origin of the modified layer.

23. The non-contact processing method as claimed in claim 20, wherein in the separation step, further comprising applying an electric field on the solid structure, thereby assisting the separation energy source in separating or thinning the solid structure at the modified layer.

24. The non-contact processing method as claimed in claim 20, wherein in the separation step, further comprising causing a thermal expansion material infiltrating into the modified layer of the solid structure and expanding a volume of the thermal expansion material, thereby assisting the separation energy source in separating or thinning the solid structure at the modified layer.

25. The non-contact processing method as claimed in claim 20, wherein after performing the separation step, further comprising performing a grinding or polishing step of the processing procedure for grinding or polishing the separated or thinned solid structure by using a grinding or polishing unit.

26. The non-contact processing method as claimed in claim 25, wherein in or after performing the modification step, the separation step and/or the grinding or polishing step, further comprising performing a heating step of the processing procedure for heating the solid structure.

27. The non-contact processing method as claimed in claim 20, further comprising performing a filling step for filling surface cracks on the processing target area of the separated or thinned solid structure.

28. The non-contact processing method as claimed in claim 20, wherein in the processing procedure, further comprising performing a subsequent step on the separated or thinned solid structure, the subsequent step is selected from a group consisting of coating step, vapor deposition step, lithography step, photolithography step, etching step and diffusion step.

29. The non-contact processing method as claimed in claim 20, wherein the processing target area is located on partial areas of the solid structure.

5

\* \* \* \* \*